United States Patent
Heminger et al.

(10) Patent No.: US 6,549,155 B1
(45) Date of Patent: Apr. 15, 2003

(54) SIGNAL CONVERSION USING COARSE AND FINE DIGITAL TO ANALOG CONVERTERS

(75) Inventors: Mark David Heminger, Rochester, MN (US); Robert Edward Jansen, Byron, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/060,856

(22) Filed: Jan. 30, 2002

(51) Int. Cl.$^7$ ................................................ H03M 1/66
(52) U.S. Cl. ........................ 341/144; 341/155; 341/145
(58) Field of Search ................................. 341/144, 145, 341/155

(56) References Cited

U.S. PATENT DOCUMENTS

| | | | | |
|---|---|---|---|---|
| 4,410,879 A | * | 10/1983 | Gumm et al. | 341/118 |
| 4,544,911 A | * | 10/1985 | Altman et al. | 341/118 |
| 4,595,910 A | * | 6/1986 | Wine | 341/142 |
| 4,998,108 A | * | 3/1991 | Ginthner et al. | 341/142 |
| 5,451,946 A | * | 9/1995 | Smith et al. | 341/118 |
| 5,764,172 A | * | 6/1998 | Rodal | 341/145 |
| 5,801,655 A | * | 9/1998 | Imamura | 341/136 |
| 6,204,790 B1 | * | 3/2001 | Jin et al. | 341/145 |
| 6,317,067 B1 | * | 11/2001 | Mohindra | 341/145 |

* cited by examiner

*Primary Examiner*—Michael Tokar
*Assistant Examiner*—Khai Nguyen
(74) *Attorney, Agent, or Firm*—William B. Kempler; W. James Brady; Frederick J. Telecky, Jr.

(57) ABSTRACT

Signal conversion apparatus and method with coarse and fine digital to analog converters. The output of the coarse DAC has a high gain to support wide voltage swings, while the fine DAC has a low gain to support accurate tracking control. The two outputs are combined in an analog summing junction. The apparatus and method may comprise a low pass filter connected to the coarse DAC output. The filter may be switched off during large changes to provide rapid system response, and switched on during position holding to attenuate noise from the coarse DAC. The apparatus and method may comprise a pre-charging capacitor in the filter, wherein the capacitor may be pre-charged when the filter is off, reducing the switch transient when the filter is switched on.

18 Claims, 6 Drawing Sheets

SIGNAL CONVERSION USING COARSE AND FINE DIGITAL TO ANALOG CONVERTERS

TECHNICAL FIELD

The present invention relates generally to converting electrical signals from one form to another, and more particularly to signal conversion using coarse and fine digital to analog converters.

BACKGROUND

Digital to analog converters ("DAC"s) have been used in positioning systems for many years. Generally, a digital controller, such as a microprocessor, a digital signal processor ("DSP"), or dedicated digital circuitry, generates control commands for commanding some type of actuator to a desired position. Generally, the control commands from the digital controller are digital electrical signals. Because many actuators require commands in the form of analog electrical signals, DACs are used to convert the digital signals into analog voltage or current signals.

Generally, many positioning systems are required to rapidly move an actuator from one position to a new position, and then accurately hold the actuator at the new position or within a small range of that position. In addition, the actuator may move over a large range relative to the resolution of the positioning system (e.g., the position change may represent many bits worth of movement compared to the movement equal to one bit in the digital command). This generally requires that the digital commands contain many bits so that the actuator may be positioned to within a small tolerance at a commanded position over a large range of movement.

As an example, the read (and/or write) heads used in data devices generally require movement over a large range (e.g., seek mode), and accurate positioning at a particular position (e.g., track mode). Examples include the optical heads used in optical disk drives, such as compact disc ("CD") and digital video disc ("DVD") drives, and the magnetic heads used in hard drives.

As another example, micro-electromechanical ("MEM") devices may require high resolution positioning and a large movement range relative to the bit resolution. One specific example is a MEM movable mirror assembly, as described in Laor et al., U.S. Pat. No. 6,295,154, issued Sep. 25, 2001, entitled OPTICAL SWITCHING APPARATUS," commonly assigned herewith and incorporated herein by reference. As described in detail in Laor et al., a micromirror generally is rotatable about two axis and is driven magnetically using some combination of permanent magnets and electromagnetic coils. The micromirror positioning is precisely controlled by electrical signals sent to the electromagnetic coils. Because analog signals are used to control the coils, the mirror's position is generally continuously variable over its range of motion. The precise positioning of the micromirror is accomplished by way of calibration and feedback, so that the positioning system is able to sense the mirror's position and make corrections.

A digital controller such as a DSP may be used to provide digital control commands to a micromirror. The DSP may send a coil current command in digital form to a DAC, which converts the command to an analog signal. The analog signal may then be sent to a coil current amplifier, which drives the coil and moves the micromirror. Generally, with respect to the DAC, high resolution is preferred in order to control the commanded position very precisely and with very little error due to quantization and noise. Generally, the DAC is required to have a wide voltage range to support a wide range of positions and rapid movement between them, as well as high resolution and low noise to provide accurate tracking.

In the prior art, a large dynamic range DAC with high resolution has been used in the above applications. One disadvantage, however, with a large dynamic range DAC is that it is typically expensive compared to other DACs. For example, a 16-bit quad DAC component may cost more than twice as much as a 12-bit octal DAC component, making a single 16-bit DAC more than four times as expensive as a single 12-bit DAC.

Another potential disadvantage with a large dynamic range DAC is that it may have a large differential non-linearity ("DNL") in its high resolution setting. For example, a commercially available 16-bit DAC may only be guaranteed monotonic to 14 or 15 bits. This may cause positioning discontinuities when a digital control command is converted to analog and sent to an actuator.

Another potential disadvantage with some prior art DACs, and in particular low bit-count or low resolution DACs, is that they may not be designed with high quality analog sections, and thus may inject high frequency noise into their analog output voltages. This noise may feed through the current driver and cause undesirable actuator motion during position tracking operations.

One prior art method of reducing the noise on the DAC output is to add a filter. However, one problem with using a filter is that it adds phase delay to the control current and slows down the transient response. Generally, a filter providing sufficient noise attenuation may introduce so much phase delay that it may even make the position control loop unstable or uncontrollable.

SUMMARY OF THE INVENTION

A preferred embodiment of the present invention comprises an analog micromirror apparatus having two lower resolution DACs instead of one high resolution DAC. One DAC may function as a coarse DAC and the other DAC may function as a fine DAC. Generally, the output of the coarse DAC has a higher gain than the output of the fine DAC so that it may support wide voltage swings and provide the coarse positioning portion of the position control signal. The fine DAC has lower gain so that it may support accurate tracking control and provide the fine positioning portion of the control signal. The voltage outputs of the two DACs may be combined in an analog summing junction to form the complete analog control command.

Another preferred embodiment of the present invention comprises a coarse DAC, a fine DAC, and a low pass filter connected to the output of the coarse DAC. The low pass filter generally prevents high frequency noise with the high gain of the coarse DAC signal from transferring through to the combined analog signal. The filter may also be switchable to filter or not filter the coarse DAC output. The filter may be switched off during large voltage changes to provide rapid response, and switched on during for small voltage changes to attenuate noise from the coarse DAC. The filter may comprise a capacitor, which may be pre-charged during large movements when the filter is switched off. Generally, the filter capacitor is thus already charged when the filter is switched on for a tracking operation, reducing the switch transient and avoiding a glitch on the voltage output to the actuator.

In accordance with a preferred embodiment of the present invention, an analog micromirror apparatus comprises a digital controller generating a digital control command, a coarse DAC having an input coupled to the digital controller and having a coarse DAC output, a fine DAC having an input coupled to the digital controller and having a fine DAC output, a summing amplifier coupled to the outputs of the coarse DAC and the fine DAC, and having a summed analog output, the summed output representative of the digital control command, and a driver element for orienting a mirror element, the driver element coupled to the analog output of the summing amplifier.

In accordance with another preferred embodiment of the present invention, a digital to analog converter apparatus comprises a coarse input for receiving a coarse digital value, a fine input for receiving a fine digital value, wherein the combined coarse and fine digital values represent a digital signal, a coarse DAC having an input coupled to the coarse input, and having an analog coarse output, a fine DAC having an input coupled to the fine input, and having an analog fine output, a filter coupled to the analog coarse output of the coarse DAC, and a summing amplifier having a first input coupled to the analog coarse output and a second input coupled to the analog fine output, and having a summed analog output providing an analog signal.

In accordance with another preferred embodiment of the present invention, a position control circuit for a positioning system comprises a digital controller, wherein the digital controller generates a digital control command and apportions the digital control command into a digital coarse value and a digital fine value, a coarse DAC having an input coupled to the digital controller for receiving the digital coarse value, and having an analog coarse output, a fine DAC having an input coupled to the digital controller for receiving the digital fine value, and having an analog fine output, a switch having a first input coupled to the analog coarse output, a filter having a capacitor coupled to an output of the switch, and a summing amplifier having a first input coupled to the analog coarse output and a second input coupled to the analog fine output, and having a summed analog output, corresponding to the digital control command, for controlling an actuator in the positioning system.

In accordance with another preferred embodiment of the present invention, a method for providing control commands to a micromirror device comprises generating a digital control command, apportioning the digital control command into a digital coarse value and a digital fine value, converting the digital coarse value into an analog coarse signal, converting the digital fine value into an analog fine signal, summing the analog coarse and fine signals, in accordance with a coarse/fine gain ratio, to generate an analog position signal corresponding to the digital control command, and providing the analog position signal to a driver element to orient the micromirror device.

In accordance with another preferred embodiment of the present invention, a method of generating an analog signal from a digital signal comprises apportioning the digital signal into a digital coarse value and a digital fine value, converting the digital fine value into an analog fine value, converting the digital coarse value into an analog coarse value, summing the analog coarse and fine values, in accordance with a coarse/fine gain ratio, to generate the analog signal corresponding to the digital signal, and switching on a filter coupled to the analog coarse value after a time period during which the analog coarse value remains constant.

An advantage of a preferred embodiment of the present invention is that the two narrow dynamic range DACs and their support circuitry costs less than a single wide range DAC.

Another advantage of a preferred embodiment of the present invention is that it has a lower DNL than a high resolution DAC. For example, two 12-bit DACs used to form a coarse/fine pair with a 16:1 gain ratio may effectively have 16-bit monotonicity. Generally, each 12-bit DAC has 12 bit monotonicity, and the fine DAC only contributes about $1/16^{th}$ to the total DNL, improving the effective DNL to be monotonic to 16 bits.

A further advantage of a preferred embodiment of the present invention is that it provides true 16 bit resolution over its 16 bit range. Generally, a resistor string architecture is used in a 12 bit DAC, which provides accurate voltage taps to generate the output from the DAC. With this type of architecture in a DAC, less than one bit monotonicity may be achieved.

Another advantage of a preferred embodiment of the present invention is that the filter reduces noise without introducing phase delay. Generally, the filter is disabled during large-scale voltage changes, allowing for rapid voltage stewing without phase loss due to filtering. During stationary positioning or tracking mode, the filter is switched into the coarse DAC path, attenuating the noise from the coarse DAC. The fine DAC responds to small disturbances without any loss of phase because the filter is not connected to it. In addition, the coarse DAC filter generally does not introduce phase delay during tracking mode because the coarse DAC output is not changing.

Yet another advantage of a preferred embodiment of the present invention is that pre-charging the filter capacitor generally reduces glitches caused by switching the filter into the circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, position control of an analog micromirror apparatus. The invention may also be applied, however, to other positioning system applications, such as other MEM devices, or other DAC applications that benefit from fast response to large voltage changes combined with precise holding of a specific voltage.

Figure 1:
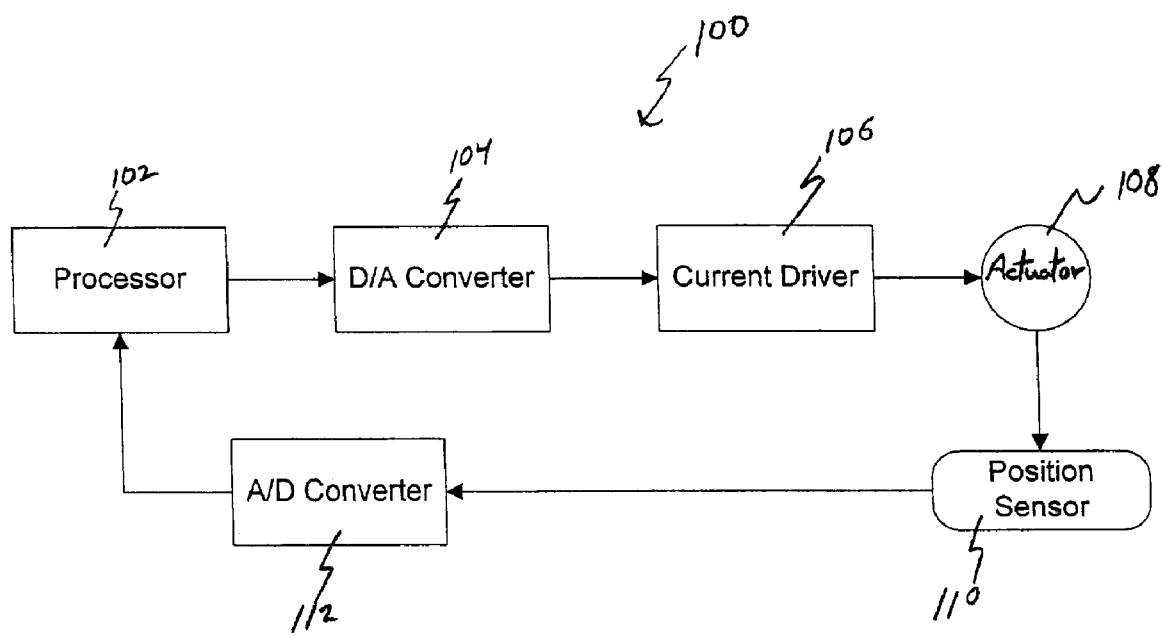
FIG. 1 is a high-level block diagram of a position control apparatus.

With reference now to FIG. 1, there is shown a high-level block diagram of a position control apparatus 100 having digital control and digital to analog conversion of the control command signal. Processor 102 generates digital control commands that are converted to analog signals by DAC 104. In accordance with a preferred embodiment of the present invention, DAC 104 comprises a coarse DAC and a fine DAC, which will be described in more detail below. The analog signals are fed into current driver 106, which generates current signals to drive actuator 108 to the commanded position. In a preferred embodiment, actuator 108 comprises coil drivers/magnets and a movable micromirror as described hereinabove. Position sensor 110 measures the position of actuator 108 and generates one or more analog signals representative of the measured position. The analog position measurement is converted to a digital signal by analog-to-digital converter ("ADC") 112, which digital signal is sent to processor 102 for processing.

Figure 2:
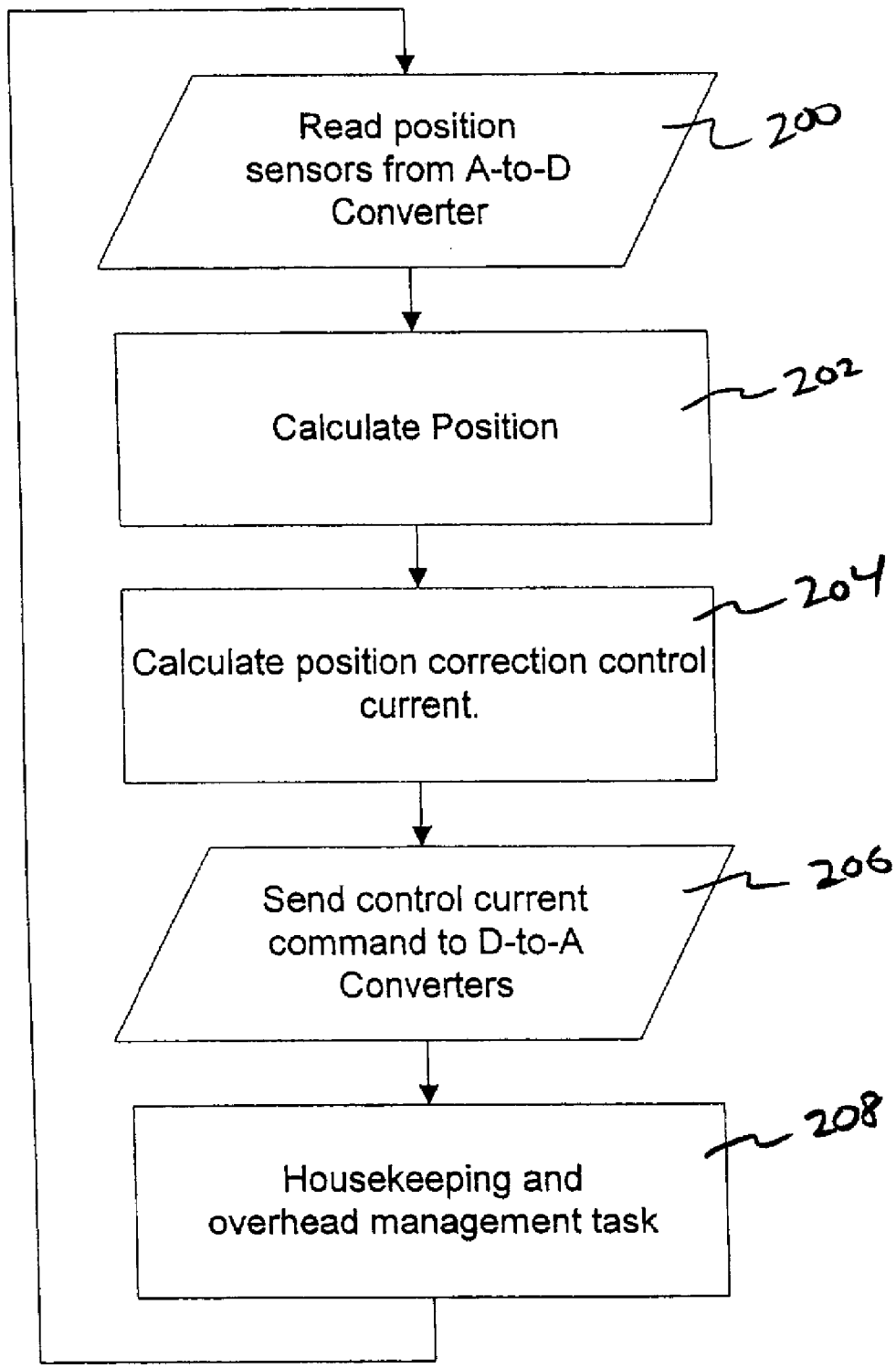
FIG. 2 is a high-level flow chart showing the operation of the apparatus of FIG. 1.

With reference to FIG. 2, there is shown a high level flowchart showing the servo control operation of the positioning system of FIG. 1. Generally, each servo sample time, the processor reads the voltages from position sensors provided via an ADC, as shown in block 200. In step 202, the processor calculates the position of the actuator. The processor then performs calculations to determine the command values to send to the actuator to move it to a desired position in step 204. These commands are sent to the actuator via the DAC in step 206. Other, non-time critical tasks, such as housekeeping and overhead management, may be performed in step 208.

Figure 3:
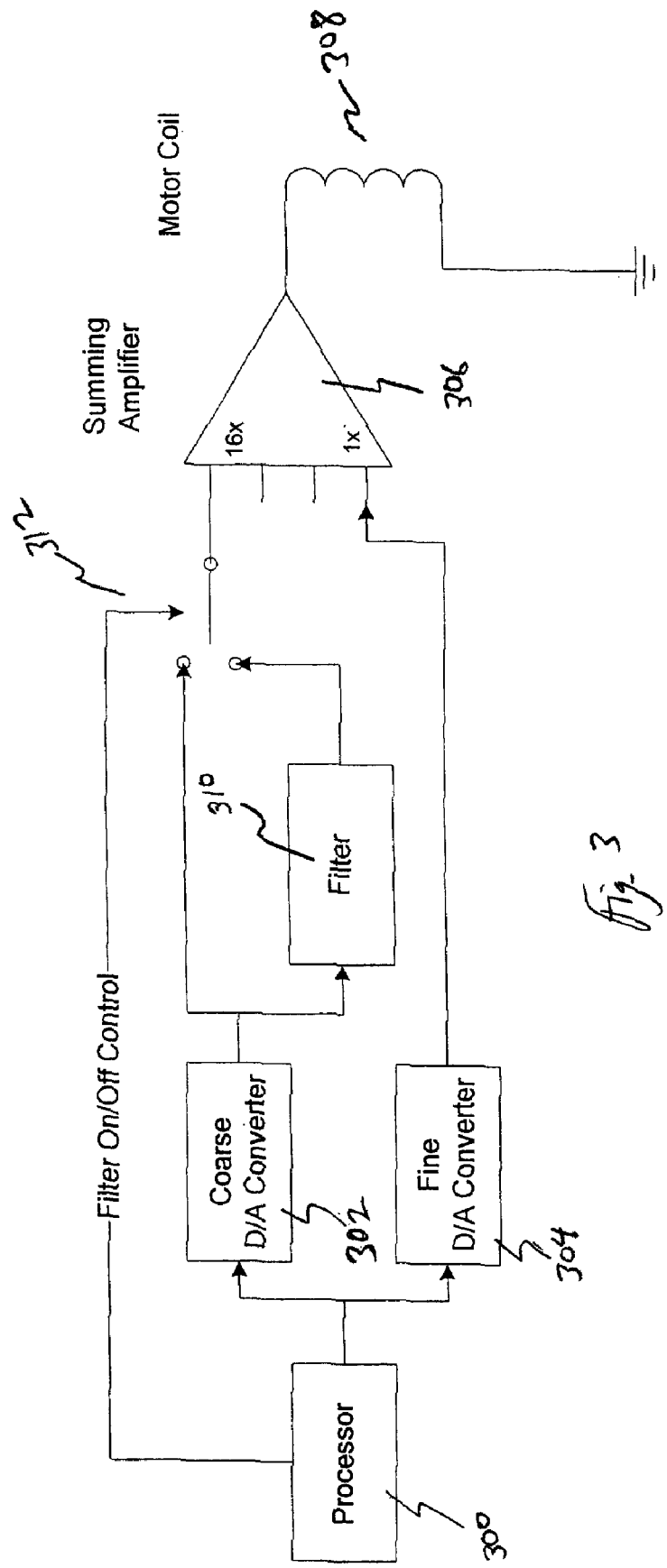
FIG. 3 is a block diagram of a position control apparatus with expanded detail for the DAC.

A more detailed block diagram illustrating the components of the DAC, in accordance with one preferred embodiment, is shown in FIG. 3. Processor 300 generates a digital control command that it divides into two segments, a coarse value and a fine value. Processor 300 sends these signals to the corresponding DACs, coarse DAC 302 and fine DAC 304. After converting the digital signals to analog, the analog signals from coarse DAC 302 and fine DAC 304 are combined by analog summing amplifier 306.

The combination of the two analog signals provides the current in motor coil 308 corresponding to the initial digital control command from the processor. The coarse DAC signal is given a high gain to support wide voltage swings, while the fine DAC signal is given a low gain to control small changes in output voltage. Because the outputs of the two DACs are being combined to form one signal, each of the DACs may have a narrower dynamic range than a single DAC application, yet they may still support a wide voltage range. In a preferred embodiment, two 12-bit DACs may be combine with a 16:1 coarse/fine gain ratio or weighting ratio to provide effectively 16 bits of resolution. Alternatively, other values may be used for the ratio. Preferably the ratio is a power of two to simplify calculations in the processor, but a ratio other than a power of two may also be used.

In a preferred embodiment, low pass filter 310 and analog filter switch 312 are added into the coarse DAC path. When a change in voltage exceeds the range of fine DAC 304, a new value is sent to coarse DAC 302, and processor 300 sets switch 312 to feed the output from coarse DAC 302 directly to summing amplifier 306 for fast response. This mode may be used, for example, when the voltage is changing rapidly over a wide range, such as in a seek operation when there is rapid change from one position to another.

When there are only small voltage changes, within the range of fine DAC 304, such as during tracking after a seek operation, processor 300 sets switch 312 to insert filter 310 into the coarse DAC signal path. Filter 310 attenuates high frequency analog noise from coarse DAC 302 to prevent the noise from reaching the motor coil. Filter 310 will not reduce response time because coarse DAC 302 should be holding a constant value during these tracking type operations. Generally, only the output from coarse DAC 302 is filtered because any noise output from fine DAC 304 is attenuated by the coarse/fine ratio in summing amplifier 306. This allows the fine DAC to quickly respond to small disturbances in the motor position without a filter slowing it down.

Figure 4:
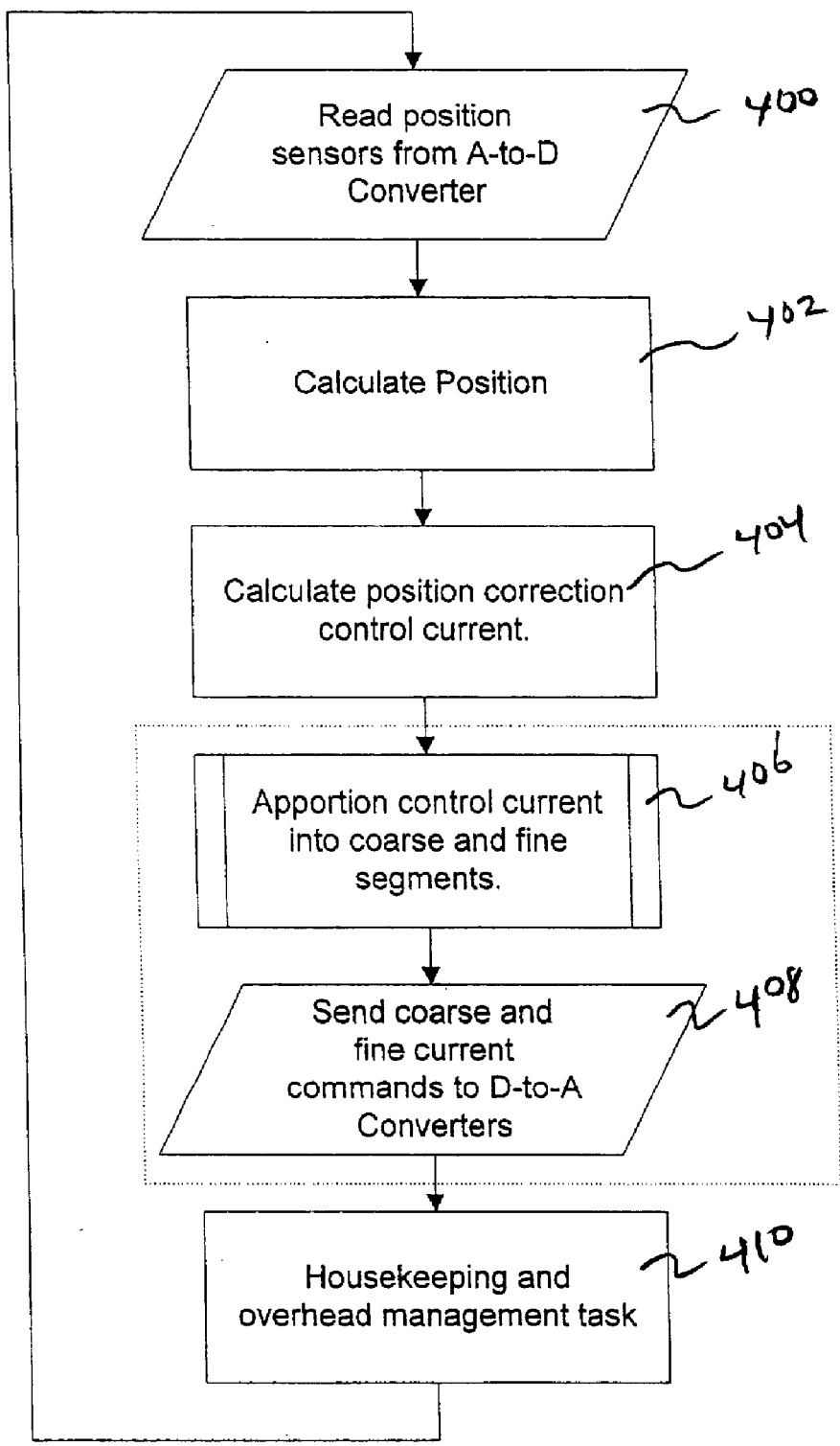
FIG. 4 is a flow chart showing the operation of the apparatus of FIG. 3.

With reference to FIG. 4, there is shown a flowchart showing the position control operation of the positioning system of FIG. 3. Generally, each servo sample time, the processor reads the voltages from position sensors provided via an ADC, as shown in block 400. In step 402, the processor calculates the position of the actuator. The processor then performs calculations to determine a command value to send to the actuator to move it to a desired position in step 404. The processor apportions the control command into coarse and fine segments in step 406, and sends the coarse and fine commands to the coarse and fine DACs, respectively, in step 408. Other, non-time critical tasks, such as housekeeping and overhead management, may be performed in step 410.

In a preferred embodiment, for a large voltage change, the processor primarily only sends a command to the coarse DAC and leaves the fine DAC set at a fixed value, such as zero or in the middle of its range, during seek type operations. The processor may send a command to the fine DAC to reach the final desired position and achieve the required resolution, and to respond to small disturbances in the measured position.

In another preferred embodiment, with two 12-bit DACs and a 16 bit desired resolution, the processor writes the 12 most significant bits to the coarse DAC and the 4 least significant bits to the fine DAC. Using a summing amplifier with a coarse/fine gain ratio of 16:1 then provides 16 bits of resolution.

Figure 5:
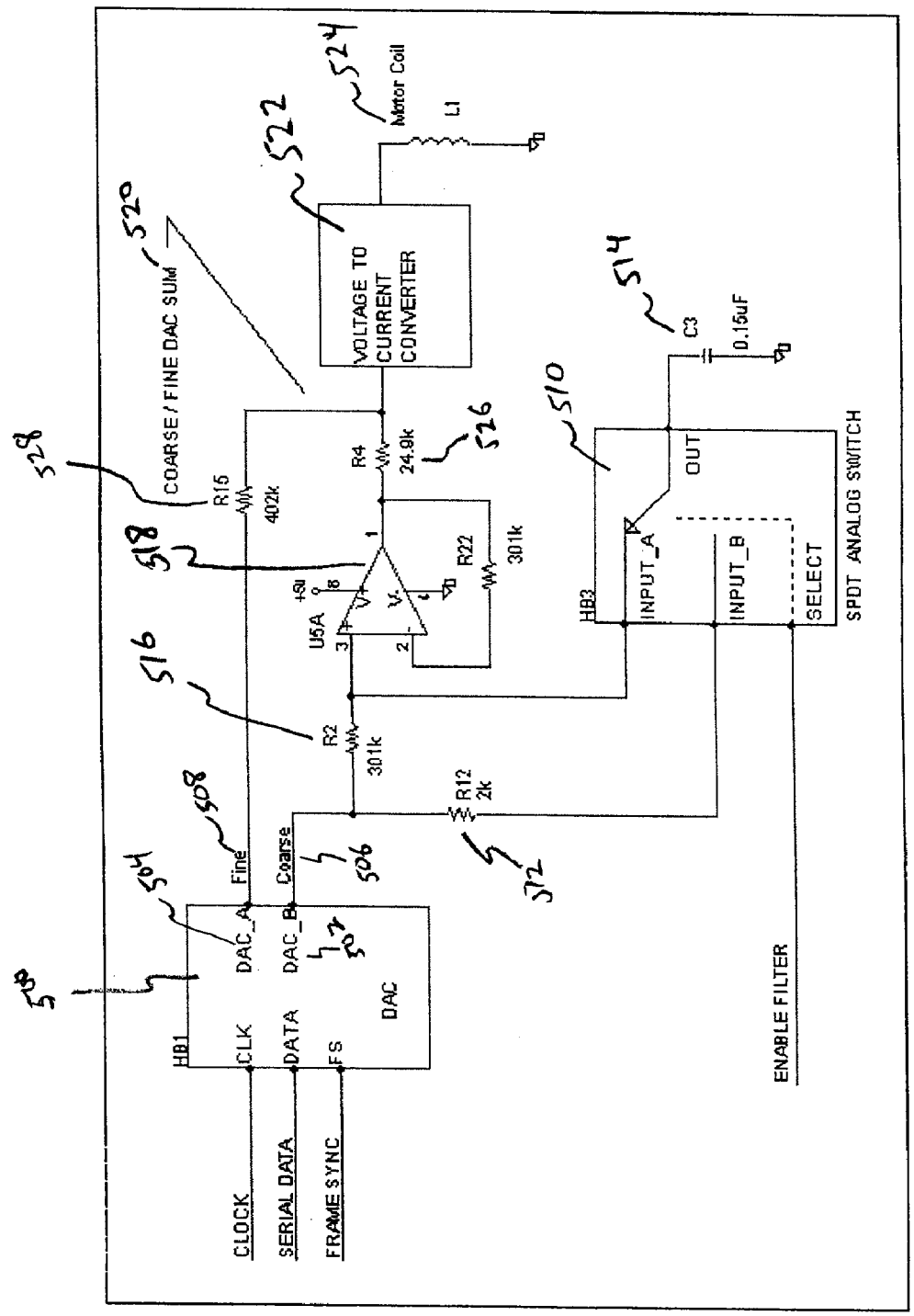
FIG. 5 is a schematic of a position control apparatus with coarse/fine DACs and a switchable filter.

With reference now to FIG. 5, there is shown a schematic of a position control apparatus with coarse and fine DACs. The coarse DAC and fine DAC are preferably on the same module, using, for example, an eight channel DAC module. A processor sends coarse and fine segments of a control command to DAC module 500. Coarse DAC 502 converts the coarse value into an analog coarse signal 506, and fine DAC 504 converts the fine value into an analog fine signal 508.

When there is a large position change and a large change in the DAC output is required, analog switch 510 is switched to INPUT_B, essentially switching off the filter so that coarse signal 506 may respond quickly without any filter induced phase delay.

In a preferred embodiment, switching the filter off by selecting INPUT_B in switch 510 also activates a capacitor pre-charge via resistor 512. In this switch position, filter capacitor 514 is continually charging to the voltage output from coarse DAC 502. This precharge function helps to avoid output voltage glitches when the filter is eventually switched on. Resistor 512 preferably has a small value, such as 2K ohms, to provide a small time constant for precharging capacitor 514 to a constant value quickly. Resistor 512 may be given a smaller value if the DAC output specifications are not exceeded, or if a buffer is inserted into the circuit between coarse DAC 502 and resistor 512. This may charge capacitor 514 faster, or allow a larger value capacitor to be used.

At the end of a position change and when the coarse signal 506 reaches a constant value, the voltage on capacitor 514 also reaches a constant value. At this time, switch 510 is switched from INPUT_B to INPUT_A, inserting the filter, comprising capacitor 514 and resistor 516, into the coarse DAC signal path. Because capacitor 514 is precharged, glitches caused by the switch should be minimized. The time constant of the filter is large, causing it to filter out high frequency noise before the coarse signal enters op amp 518. In an alternative embodiment, a higher order filter may be used instead of a single pole filter.

The coarse DAC signal (filtered or unfiltered) and fine DAC signal are summed together at analog summing junction 520 via resistor 526 and resistor 528, respectively. In a preferred embodiment, the ratio between resistors 526 and 528 is 16:1, which effectively causes the coarse DAC to have 16 times more effect on the control current than the fine DAC. The summed signal is input to voltage to current converter 522, which generates the current signal for controlling motor coil 524. Alternatively, a voltage amplifier may be used in place of the voltage to current converter.

Figure 6:
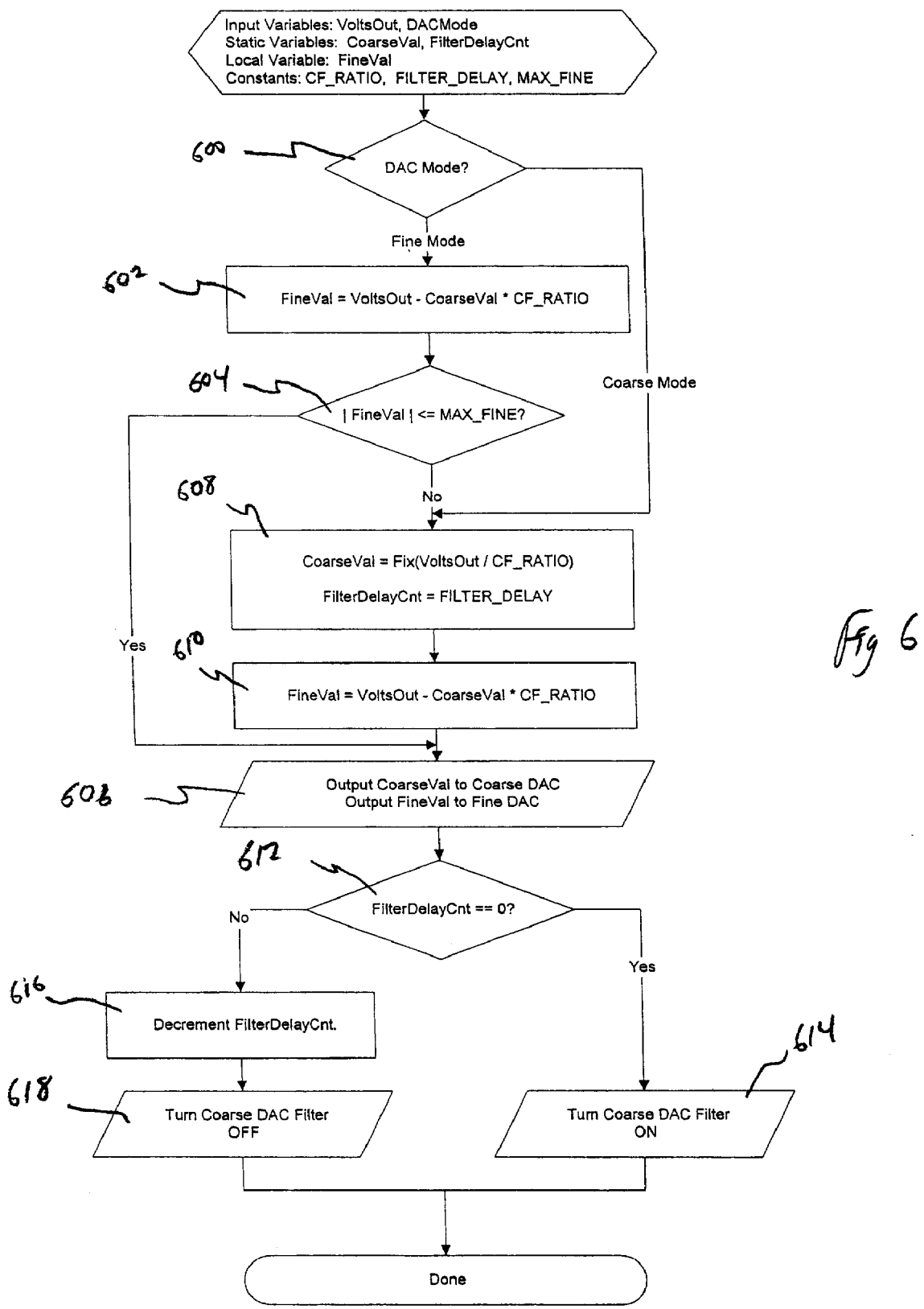
FIG. 6 is a flow chart showing the operation of the apparatus of FIG. 5.

With reference now to FIG. 6, there is shown a flow chart providing an expanded view of steps 406 and 408 from the flow chart of FIG. 4. As described with respect to FIG. 4, the position is read and the required coil current to the motor is calculated. Then the processor apportions the amount of coil current to be allocated to the coarse DAC and the amount to be allocated to the fine DAC in a manner described below. In step 600 the processor determines which DAC mode the control loop is operating in, primarily coarse mode or primarily fine mode. If running in fine mode, such as during a tracking operation, the fine value is calculated in step 602 as:

FineVal=VoltsOut−CoarseVal*$CF\_RATIO$

In this embodiment, CoarseVal has already been calculated in previous operations, and CF_RATIO is preferably 16:1.

In step 604, the fine value is checked to make sure it is within the range of the fine DAC. If it is within the allowable range, then the processor outputs the coarse and fine values to the respective DACs in step 606. In step 604, if the range of the fine DAC has been exceeded, then the coarse value is calculated in step 608 as:

CoarseVal=Fix (VoltsOut/$CF\_RATIO$)

Then the fine value is recalculated in step 610 using the same equation as described before, and the coarse and fine values are output to the respective DACs in step 606. If the range of the fine DAC is ever exceeded, both the coarse and fine values are changed. In particular, the coarse DAC is changed with a big enough step to center the fine DAC back in the middle of its range. Once the coarse DAC value is set, the coarse DAC should not need to be changed again.

Referring back to step 600, if the DAC mode is coarse mode, such as during a seek operation, the processor skips over steps 602 and 604 and directly calculates the coarse value and then the fine value.

Referring to step 608, any time that the coarse value is changed, a filter delay count variable is set to an initial value representing the time that the filter is to remain switched off. In a preferred embodiment, the value of FILTER_DELAY is eight.

After the coarse and fine values are output in step 606, the filter delay counter is checked to see if it is equal to zero in step 612. If it is equal to zero, then the coarse DAC filter is turned on in step 614. If the filter delay counter is not zero, then the filter delay counter is decremented in step 616 and the coarse DAC filter is turned off in step 618. Therefore, if eight consecutive sample periods do not change the value of the coarse DAC, then the coarse DAC filter is turned on. After 8 samples the capacitor should be charged to the coarse DAC value, so turning the filter on should not introduce a glitch into the analog signal.

Every time the coarse DAC is changed, the filter is shut off, and it is left off for a certain number of samples. In this application it is 8 samples at 5,000 samples per second. $8/5,000$ of a second would be the filter off time to allow it to pre-charge that capacitor, and then the filter is turned back on and left on.

As an alternative to taking the full voltage change in the coarse value in one step, the coarse DAC value may be changed the least amount that would still keep it just inside the fine DAC's range. Generally, taking a smaller step will introduce smaller glitches, but then it is more likely that a similar size step will need to be taken within a short time later. The specific embodiment chosen depends on the application and its glitch tolerance.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or in dedicated circuitry or in programmable circuitry, or a combination thereof. As another example, it will be readily understood by those skilled in the art that the order of the steps in the flowcharts may be altered and still remain within the scope of the present invention. As yet another example, the number of DACs used may be more than two. In addition, specific circuit or algorithm implementations may be changed while remaining within the scope of the present invention. For example, a different circuit implementation may be used for the summing amplifier than the preferred embodiment op amp and resistor network, yet still remain within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An analog micromirror apparatus comprising:
   a digital controller generating a digital control command;
   a coarse digital to analog converter (DAC) having an input coupled to the digital controller and having a coarse DAC output;
   a filter coupled to the coarse DAC output, and;
   a switch disposed between the coarse DAC and the filter, wherein the switch has a first input coupled to the coarse DAC and an output coupled to the filter;
   a fine DAC having an input coupled to the digital controller and having a fine DAC output;
   a summing amplifier coupled to the outputs of the coarse DAC and the fine DAC, and having a summed analog output, the summed output representative of the digital control command; and
   a driver element for orienting a mirror element, the driver element coupled to the analog output of the summing amplifier.

2. The analog micromirror apparatus of claim 1, wherein the filter comprises a capacitor, wherein the apparatus further comprises a pre-charge circuit coupled between the coarse DAC output and a second input of the switch, and wherein the pre-charge circuit is coupled to the capacitor when the filter is disabled by the switch.

3. The analog micromirror apparatus of claim 1, further comprising a voltage to current converter coupled between the summing amplifier and the driver element.

4. The analog micromirror apparatus of claim 1, further comprising a voltage amplifier coupled between the summing amplifier and the driver element.

5. A method for providing control commands to a micromirror device, the method comprising:
   generating a digital control command;
   apportioning the digital control command into a digital coarse value and a digital fine value;
   converting the digital coarse value into an analog coarse signal;
   switching on a filter to perform the filtering of the analog coarse signal;
   filtering the analog coarse signal before the summing of the analog coarse and fine signals;
   converting the digital fine value into an analog fine signal;
   summing the analog coarse and fine signals, in accordance with a coarse/fine gain ratio, to generate an analog position signal corresponding to the digital control command; and
   providing the analog position signal to a driver element to orient the micromirror device.

6. The method of claim 5, further comprising pre-charging a capacitor in the filter, to a value of the analog coarse signal, before the switching on of the filter.

7. A digital to analog converter apparatus for converting a digital signal into an analog signal, the digital to analog converter comprising:
   a coarse input for receiving a coarse digital value;
   a fine input for receiving a fine digital value, wherein the combined coarse and fine digital values represent the digital signal;
   a coarse DAC having an input coupled to the coarse input, and having an analog coarse output;
   a switch disposed between the analog coarse output and a filter, wherein the switch has a first input coupled to the analog coarse output, and an output coupled to the filter;
   a fine DAC having an input coupled to the fine input, and having an analog fine output and
   a summing amplifier having a first input coupled to the analog coarse output and a second input coupled to the analog fine output, and having a summed analog output providing the analog signal.

8. The digital to analog converter apparatus of claim 7, further comprising a switch disposed between the analog coarse output and the filter, wherein the switch has a first input coupled to the analog coarse output, and an output coupled to the filter.

9. The digital to analog converter apparatus of claim 7, wherein the filter comprises a capacitor, wherein the apparatus further comprises a pre-charge circuit coupled between the analog coarse output and a second input of the switch, and wherein the pre-charge circuit is coupled to the capacitor when the filter is disabled by the switch.

10. A method of generating an analog signal from a digital signal, the method comprising:
    apportioning the digital signal into a digital coarse value and a digital fine value;
    converting the digital fine value into an analog fine value;
    converting the digital coarse value into an analog coarse value;
    summing the analog coarse and fine values, in accordance with a coarse/fine gain ratio, to generate the analog signal corresponding to the digital signal; and
    switching on a filter coupled to the analog coarse value after a time period during which the analog coarse value remains constant.

11. The method of claim 10, further comprising pre-charging a capacitor in the filter to the analog coarse value before the switching on of the filter.

12. The method of claim 10, further comprising switching off the filter when the analog coarse value changes.

13. The method of claim 12, further comprising pre-charging a capacitor in the filter to a new analog coarse value when the filter is switched off.

14. The method of claim 13, further comprising switching on the filter after a time period during which the new analog coarse value remains constant.

15. A position control circuit for a positioning system, the position control circuit comprising:
    a digital controller, wherein the digital controller generates a digital control command and apportions the digital control command into a digital coarse value and a digital fine value;
    a coarse DAC having an input coupled to the digital controller for receiving the digital coarse value, and having an analog coarse output;
    a fine DAC having an input coupled to the digital controller for receiving the digital fine value, and having an analog fine output;
    a switch having a first input coupled to the analog coarse output;
    a filter having a capacitor coupled to an output of the switch; and
    a summing amplifier having a first input coupled to the analog coarse output and a second input coupled to the analog fine output, and having a summed analog output, corresponding to the digital control command, for controlling an actuator in the positioning system.

16. The position control circuit of claim 15, further comprising a pre-charge circuit coupled between the analog coarse output and a second input of the switch.

17. The position control circuit of claim 16, further comprising a voltage to current converter coupled between the summing amplifier and the actuator.

18. The position control circuit of claim 16, further comprising a voltage amplifier coupled between the summing amplifier and the actuator.

* * * * *